United States Patent
Park et al.

(10) Patent No.: US 11,659,713 B2
(45) Date of Patent: *May 23, 2023

(54) SEMICONDUCTOR DEVICES INCLUDING A CONTACT STRUCTURE THAT CONTACTS A DUMMY CHANNEL STRUCTURE

(71) Applicant: Samsung Electronics Co., Ltd., Suwon-si (KR)

(72) Inventors: Joo Won Park, Hwaseong-si (KR); Kyeong Jin Park, Hwaseong-si (KR); Kwang Soo Kim, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/495,320

(22) Filed: Oct. 6, 2021

(65) Prior Publication Data

US 2022/0028878 A1 Jan. 27, 2022

Related U.S. Application Data

(63) Continuation of application No. 16/451,385, filed on Jun. 25, 2019, now Pat. No. 11,145,669.

(30) Foreign Application Priority Data

Dec. 11, 2018 (KR) ........................ 10-2018-0158769

(51) Int. Cl.
*H01L 27/11573* (2017.01)
*H01L 23/535* (2006.01)
*H01L 27/11582* (2017.01)

(52) U.S. Cl.
CPC ...... *H01L 27/11573* (2013.01); *H01L 23/535* (2013.01); *H01L 27/11582* (2013.01)

(58) Field of Classification Search
None
See application file for complete search history.

(56) References Cited

U.S. PATENT DOCUMENTS

| 8,426,908 | B2 | 4/2013 | Higashi |
| 9,362,306 | B2 | 6/2016 | Park et al. |
| 9,576,967 | B1 | 2/2017 | Kimura et al. |
| 9,881,929 | B1 | 1/2018 | Ravikirthi et al. |
| 9,991,271 | B2 | 6/2018 | Kang et al. |
| 10,014,316 | B2 | 7/2018 | Yu et al. |
| 11,145,669 | B2 * | 10/2021 | Park .................. H01L 27/11582 |
| 2016/0111439 | A1 | 4/2016 | Tsutsumi et al. |

(Continued)

FOREIGN PATENT DOCUMENTS

| JP | 4922370 B2 | 2/2012 |
| KR | 101136764 B1 | 4/2012 |

(Continued)

*Primary Examiner* — Telly D Green
(74) *Attorney, Agent, or Firm* — Myers Bigel, P.A.

(57) ABSTRACT

Semiconductor devices are provided. A semiconductor device includes a substrate and a stacked structure in which a plurality of insulating layers and a plurality of electrode layers are alternately stacked on the substrate. The semiconductor device includes a plurality of dummy channel structures that pass through the stacked structure. Moreover, the semiconductor device includes a contact structure in contact with at least one of the plurality of dummy channel structures adjacent thereto, and in contact with one of the plurality of electrode layers.

20 Claims, 12 Drawing Sheets

(56) References Cited

U.S. PATENT DOCUMENTS

| | | |
|---|---|---|
| 2017/0040337 A1 | 2/2017 | Kim et al. |
| 2017/0092651 A1 | 3/2017 | Kim et al. |
| 2017/0207232 A1 | 7/2017 | You et al. |
| 2017/0358356 A1 | 12/2017 | Lee |
| 2017/0358590 A1 | 12/2017 | Kang et al. |
| 2018/0053768 A1 | 2/2018 | Kim et al. |
| 2018/0342528 A1 | 11/2018 | Lee |
| 2018/0350830 A1 | 12/2018 | Lim et al. |
| 2019/0157282 A1 | 5/2019 | Jung |
| 2019/0157283 A1 | 5/2019 | Jung et al. |
| 2019/0267088 A1 | 8/2019 | Jeon et al. |
| 2019/0287984 A1 | 9/2019 | Yang et al. |
| 2019/0355740 A1 | 11/2019 | Hong et al. |
| 2020/0185408 A1 | 6/2020 | Song et al. |
| 2020/0194447 A1 | 6/2020 | Sun et al. |

FOREIGN PATENT DOCUMENTS

| | | |
|---|---|---|
| KR | 1020150133914 | 12/2015 |
| KR | 20170086746 A | 7/2017 |
| KR | 101820528 B1 | 1/2018 |

\* cited by examiner

SEMICONDUCTOR DEVICES INCLUDING A CONTACT STRUCTURE THAT CONTACTS A DUMMY CHANNEL STRUCTURE

CROSS-REFERENCE TO RELATED APPLICATIONS

The present application is a continuation application of U.S. patent application Ser. No. 16/451,385, filed on Jun. 25, 2019, now U.S. Pat. No. 11,145,669, which claims priority under 35 U.S.C. § 119 to and the benefit of Korean Patent Application No. 10-2018-0158769, filed on Dec. 11, 2018, in the Korean Intellectual Property Office (KIPO), the entire contents of each of which are hereby incorporated by reference.

BACKGROUND

1. Field

The present disclosure relates to semiconductor devices having a contact structure.

2. Description of Related Art

As semiconductor devices are becoming highly integrated, the number of electrode layers stacked in a stacked structure is gradually increasing. Each of the plurality of electrode layers may be electrically connected to an element/structure that is outside of the stacked structure through a contact plug. A plurality of contact plugs having a high aspect ratio may make it difficult for the semiconductor devices to be highly integrated.

SUMMARY

Example embodiments of the inventive concepts are directed to providing a semiconductor device which is advantageous for high integration while preventing/inhibiting a leakage current and a method of forming the same.

According to example embodiments, a semiconductor device is provided that may include a substrate having a cell region and a connection region adjacent to the cell region. The semiconductor device may include a stacked structure in which a plurality of insulating layers and a plurality of electrode layers are alternately stacked on the substrate. The semiconductor device may include a plurality of cell channel structures in the cell region and passing through the stacked structure. The semiconductor device may include a plurality of dummy channel structures in the connection region and passing through the stacked structure. The semiconductor device may include a contact structure in the connection region and in contact with one of the plurality of electrode layers. Moreover, the contact structure may be in contact with at least one of the plurality of dummy channel structures adjacent thereto.

According to example embodiments, a semiconductor device is provided that may include a substrate and a stacked structure in which a plurality of insulating layers and a plurality of electrode layers are alternately stacked on the substrate. The semiconductor device may include a plurality of dummy channel structures that pass through the stacked structure. Moreover, the semiconductor device may include a contact structure in contact with at least one of the plurality of dummy channel structures adjacent thereto, and in contact with one of the plurality of electrode layers.

According to example embodiments, a semiconductor device is provided that may include a substrate and a stacked structure in which a plurality of insulating layers and a plurality of electrode layers are alternately stacked on the substrate. The semiconductor device may include a plurality of cell channel structures that pass through the stacked structure. The semiconductor device may include a plurality of dummy channel structures that pass through the stacked structure and are spaced apart from the plurality of cell channel structures. Moreover, the semiconductor device may include a contact structure in contact with at least one of the plurality of dummy channel structures adjacent thereto, and in contact with one of the plurality of electrode layers.

DETAILED DESCRIPTION

Figure 1:
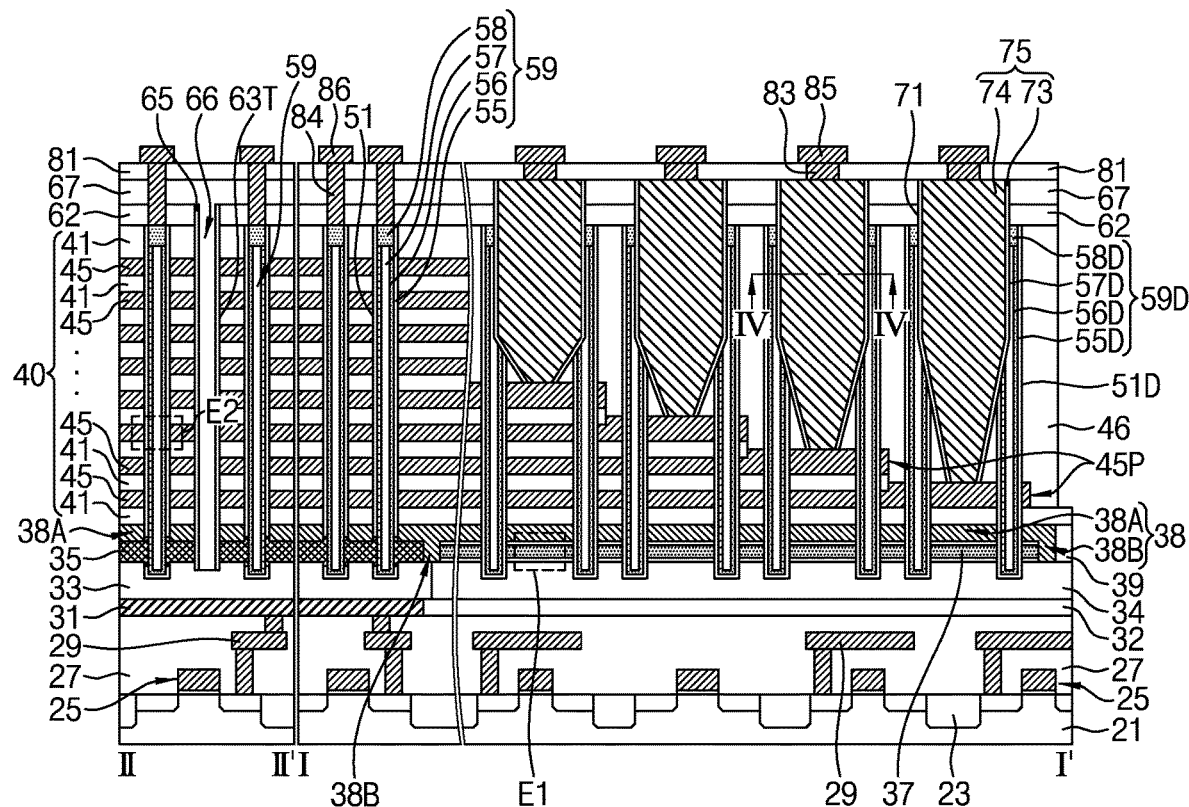
FIGS. 1 and 2 are vertical cross-sectional views of a semiconductor device according to example embodiments.
Figure 2:
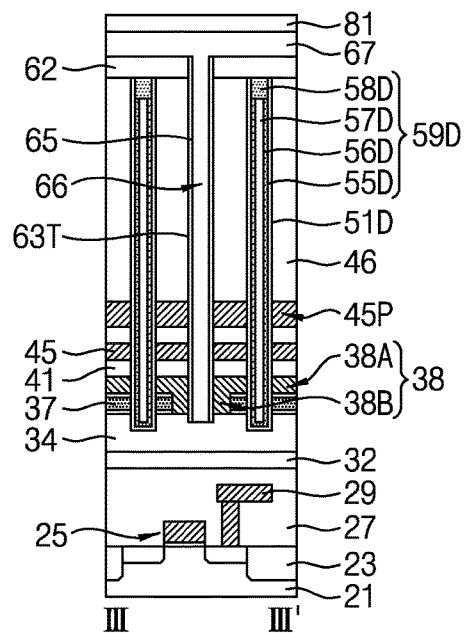
Figure 3:
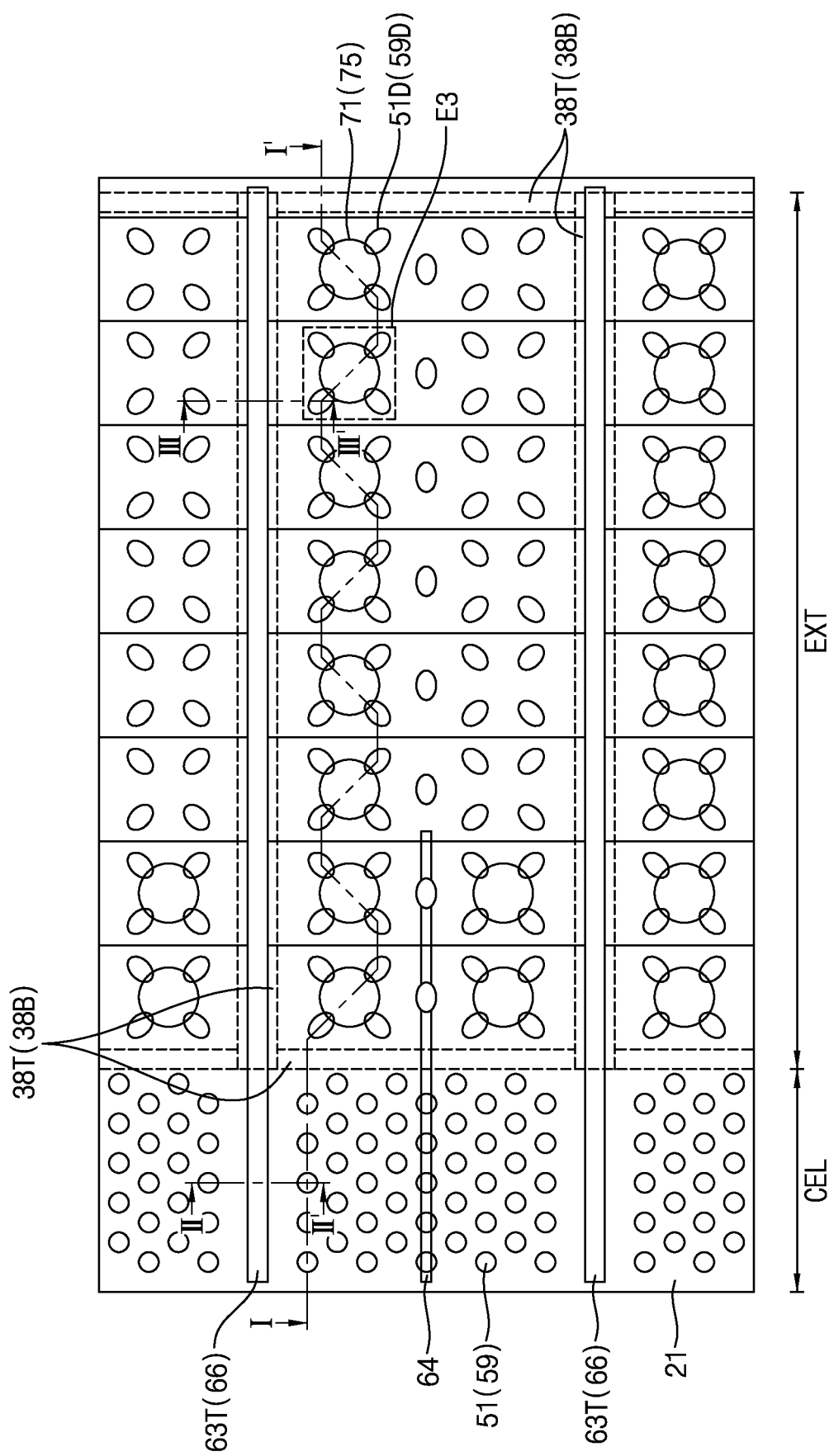
FIG. 3 is a plan view of the semiconductor device of FIGS. 1 and 2.
Figure 9:
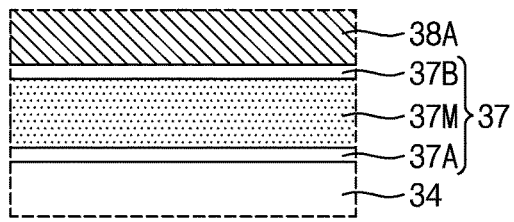
FIG. 9 is an enlarged view of a first portion E1 of FIG. 1.
Figure 10:
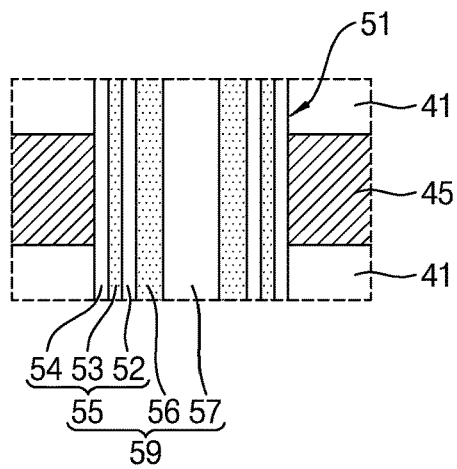
FIG. 10 is an enlarged view of a second portion E2 of FIG. 1.

Semiconductor devices according to example embodiments of the inventive concepts may include a non-volatile memory device such as a VNAND memory or a three-dimensional flash memory. The semiconductor devices according to example embodiments of the inventive concepts may be interpreted as including a cell on peripheral (COP) structure. FIGS. 1 and 2 are vertical cross-sectional views of a semiconductor device according to example embodiments of the inventive concepts, and FIG. 3 is a layout/plan view of the semiconductor device. In some example embodiments, FIG. 1 may be a cross-sectional view taken along lines I-I' and II-II' of FIG. 3, and FIG. 2 may be a cross-sectional view taken along line of FIG. 3. FIGS. 4 to 8 are horizontal sectional views of some components of the semiconductor device. In some example embodiments, FIG. 4 may correspond to a portion E3 of FIG. 3 and may be a horizontal sectional view taken along line IV-IV' of FIG. 1. FIG. 9 is an enlarged view showing a first portion E1 of FIG. 1 in detail, and FIG. 10 is an enlarged view showing a second portion E2 of FIG. 1 in detail.

Referring to FIG. 1, a semiconductor device according to some example embodiments of the inventive concepts may include a substrate 21, a first lower insulating layer 23, a plurality of transistors 25, a second lower insulating layer 27, a plurality of peripheral circuit interconnections 29, a lower embedded conductive layer 31, a third lower insulating layer 32, an intermediate embedded conductive layer 33, a fourth lower insulating layer 34, an alternate conductive line (e.g., a source line) 35, a source mold layer (e.g., a source insulating layer) 37, a support 38, a fifth lower insulating layer 39, a stacked (e.g., "stack") structure 40, an interlayer insulating layer 46, a plurality of cell channel holes 51, a plurality of cell channel structures 59, a plurality of dummy channel holes 51D, a plurality of dummy channel structures 59D, a first upper insulating layer 62, an isolation trench 63T, an isolation spacer 65, an isolation insulating layer 66, a second upper insulating layer 67, a plurality of contact holes 71, a plurality of contact structures 75, a third upper insulating layer 81, a plurality of upper plugs 83, a plurality of bit plugs 84, a plurality of upper interconnections 85, and a plurality of bit lines 86.

The support 38 may include a first portion, such as a support plate 38A, and a second portion, such as a support bar 38B. The support 38 may be referred to herein as a "support structure." The stacked structure 40 may include a plurality of insulating layers 41 and a plurality of electrode layers 45 which are alternately and repeatedly stacked. Each of the plurality of electrode layers 45 may include a pad (i.e., a respective pad portion) 45P. Each of the plurality of cell channel structures 59 may include an information storage pattern 55, a channel pattern 56, a core pattern 57, and a bit pad 58. Each of the plurality of dummy channel structures 59D may include a dummy information storage pattern 55D, a dummy channel pattern 56D, a dummy core pattern 57D, and a dummy bit pad 58D.

Each of the plurality of contact structures 75 may include a contact plug 74 and a contact spacer 73 which surrounds an outer side of the contact plug 74. Each of the plurality of contact structures 75 may be in direct contact with at least one of the plurality of dummy channel structures 59D adjacent thereto.

In some example embodiments, the alternate conductive line 35 may be a source line or a common source line (CSL). The isolation trench 63T may be a word line cut. Some of the plurality of electrode layers 45 may be word lines. A lowermost layer of the plurality of electrode layers 45 may be a gate-induced drain leakage (GIDL) control line. A second/next lower layer of the plurality of electrode layers 45 may be a ground selection line (GSL) or a source selection line (SSL). An uppermost layer of the plurality of electrode layers 45 may be a GIDL control line. Second and third upper layers of the plurality of electrode layers 45 may be string selection lines (SSLs) or drain selection lines (DSLs).

Referring to FIG. 2, a semiconductor device according to some example embodiments of the inventive concepts may include a substrate 21, a first lower insulating layer 23, a plurality of transistors 25, a second lower insulating layer 27, a plurality of peripheral circuit interconnections 29, a third lower insulating layer 32, a fourth lower insulating layer 34, a source mold layer 37, a support 38, a plurality of insulating layers 41, a plurality of electrode layers 45, a pad 45P, an interlayer insulating layer 46, a plurality of dummy channel holes 51D, a plurality of dummy channel structures 59D, a first upper insulating layer 62, an isolation trench 63T, an isolation spacer 65, an isolation insulating layer 66, a second upper insulating layer 67, and a third upper insulating layer 81.

Referring to FIG. 3, a semiconductor device according to some example embodiments of the inventive concepts may include a substrate 21 having a cell region CEL and a connection region EXT adjacent to the cell region CEL, a support trench 38T, a support bar 38B in the support trench 38T, a plurality of cell channel holes 51, a plurality of cell channel structures 59 in the plurality of cell channel holes 51, a plurality of dummy channel holes 51D, a plurality of dummy channel structures 59D in the plurality of dummy channel holes 51D, an isolation trench 63T, an isolation insulating layer 66 in the isolation trench 63T, a selection line isolation pattern 64, a plurality of contact holes 71, and a plurality of contact structures 75 in the plurality of contact holes 71. The connection region EXT may be formed to be continuous with the cell region CEL.

Figure 4:
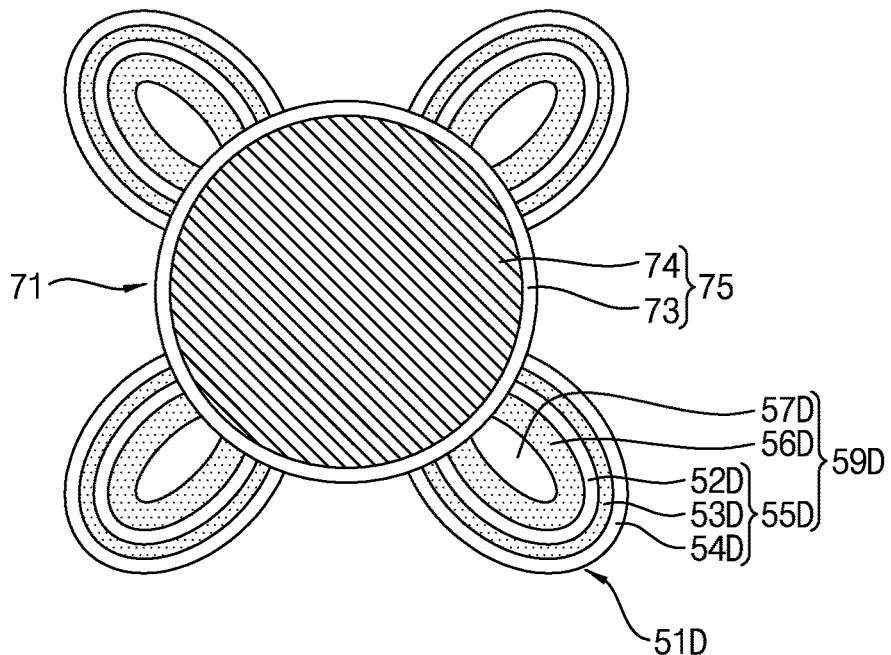
FIGS. 4-8 are horizontal sectional views along line IV-IV' of FIG. 1 according to example embodiments.

Referring to FIG. 4, a contact hole 71 may partially overlap four dummy channel holes 51D. The contact hole 71 may communicate (e.g., merge) with the four dummy channel holes 51D. A contact structure 75 may be disposed in the contact hole 71. Four dummy channel structures 59D may be disposed in the four dummy channel holes 51D, respectively. The contact structure 75 may be in direct contact with four dummy channel structures 59D spaced apart from each other.

A dummy channel pattern 56D may surround an outer side of a dummy core pattern 57D. A dummy information storage pattern 55D may surround an outer side of the dummy channel pattern 56D. The dummy information storage pattern 55D may include a dummy tunnel insulation layer 52D which surrounds the outer side of the dummy channel pattern 56D, a dummy charge storage layer 53D which surrounds an outer side of the dummy tunnel insulation layer 52D, and a dummy blocking layer 54D which surrounds an outer side of the dummy charge storage layer 53D.

The contact structure 75 may be in direct contact with the dummy channel pattern 56D and the dummy information storage pattern 55D. The contact structure 75 may pass through the dummy information storage pattern 55D and the dummy channel pattern 56D to come into direct contact with the dummy core pattern 57D. In some example embodiments, the contact structure 75 may be in direct contact with the dummy blocking layer 54D, the dummy charge storage layer 53D, the dummy tunnel insulation layer 52D, the dummy channel pattern 56D, and the dummy core pattern 57D.

Figure 5:
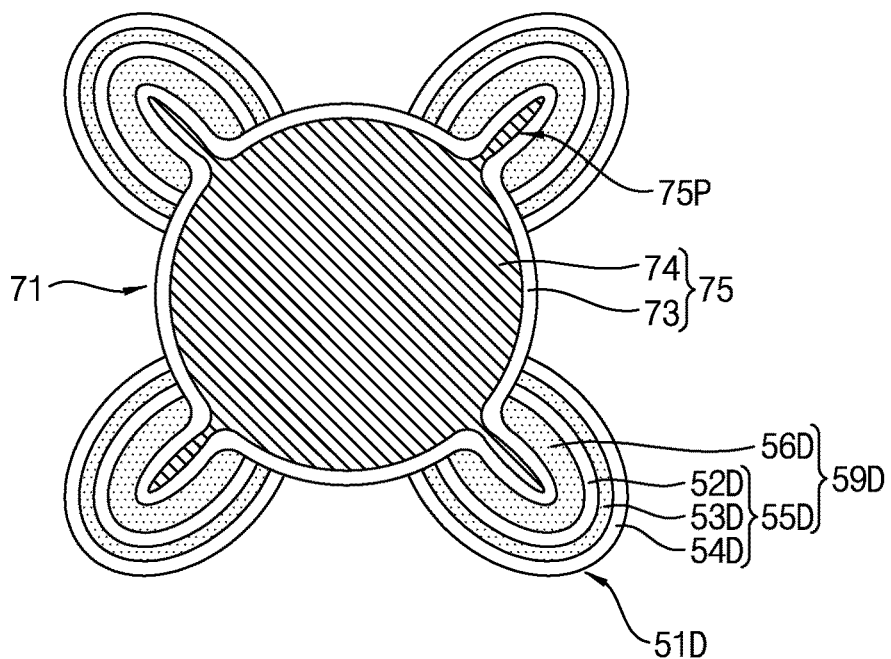

Referring to FIG. 5, a contact structure 75 may be in direct contact with four dummy channel structures 59D spaced apart from each other. The contact structure 75 may include at least one protrusion 75P. The at least one protrusion 75P of the contact structure 75 may penetrate into an inner side of at least one of the plurality of dummy channel structures 59D adjacent thereto. The at least one protrusion 75P of the contact structure 75 may overlap a center of at least one of the plurality of dummy channel structures 59D adjacent thereto. Each protrusion 75P may protrude horizontally between left and right portions of a respective one of the dummy channel structures 59D. For example, a dummy channel pattern 56D may have left and right portions that are on left and right sidewalls, respectively, of a protrusion 75P.

Figure 6:
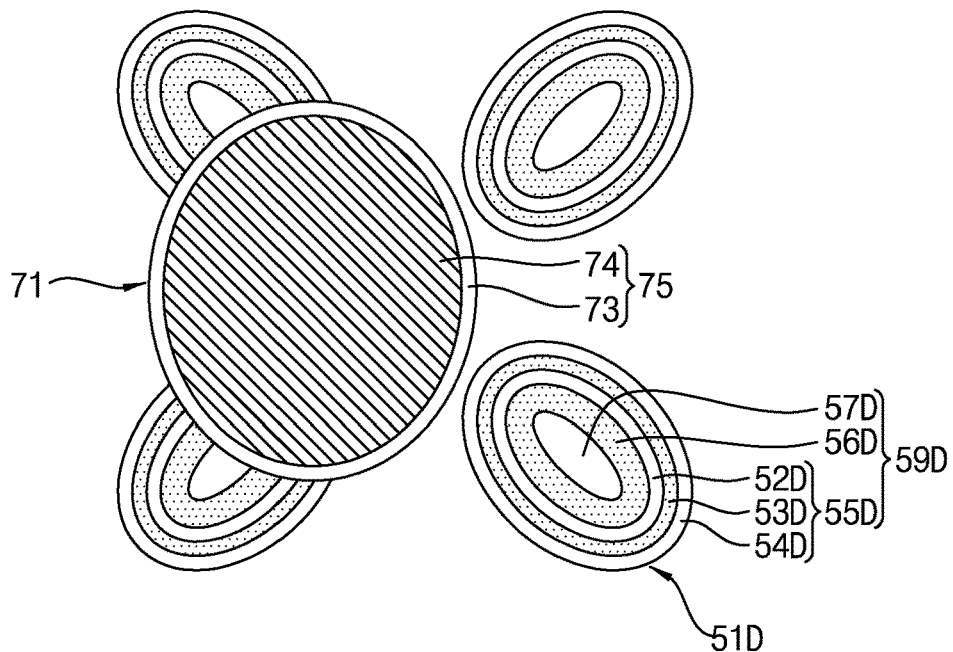

Referring to FIG. 6, a contact structure 75 may be in direct contact with only two dummy channel structures 59D spaced apart from each other.

Figure 7:
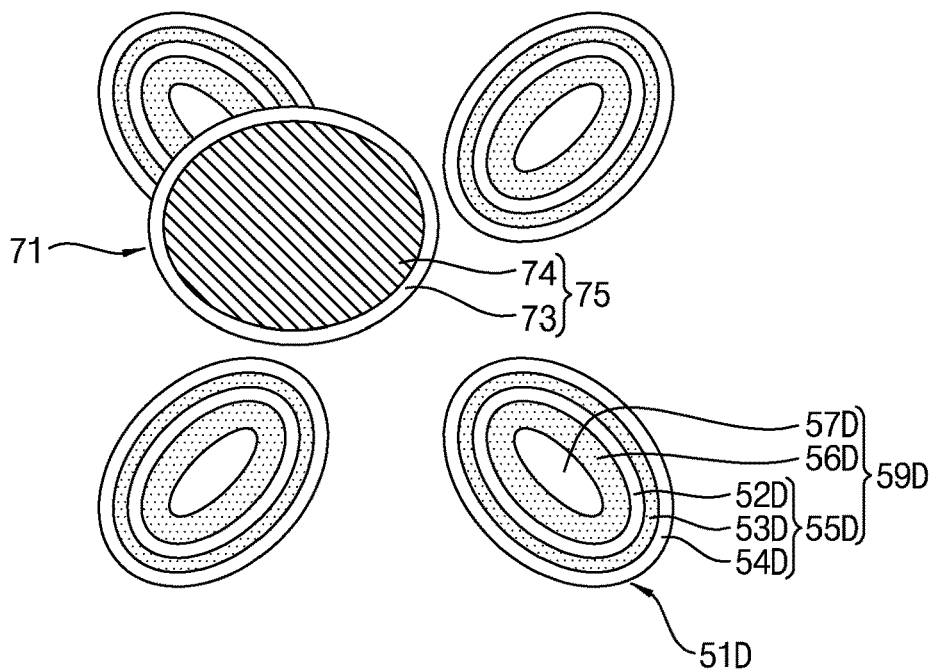

Referring to FIG. 7, a contact structure 75 may be in direct contact with only one of the plurality of dummy channel structures 59D spaced apart from each other, which is adjacent thereto.

Figure 8:
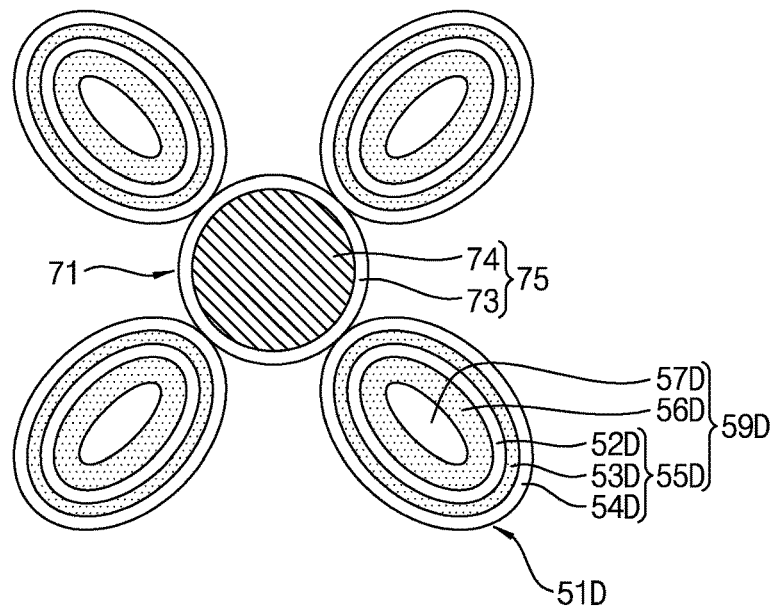

Referring to FIG. 8, a contact structure 75 may be in direct contact with four dummy channel structures 59D spaced apart from each other. An outer side surface of a contact spacer 73 may be in direct contact with an outer side surface of a dummy blocking layer 54D.

Referring to FIG. 9, the source mold layer 37 may include a lower source mold layer 37A, an intermediate source mold layer 37M, and an upper source mold layer 37B which are sequentially stacked. A lower surface of the lower source mold layer 37A may be in direct contact with the fourth lower insulating layer 34. An upper surface of the upper source mold layer 37B may be in direct contact with the support plate 38A.

Referring to FIG. 10, the channel pattern 56 may surround an outer side of the core pattern 57. The information storage pattern 55 may surround an outer side of the channel pattern 56. The information storage pattern 55 may include a tunnel insulation layer 52 which surrounds the outer side of the channel pattern 56, a charge storage layer 53 which surrounds an outer side of the tunnel insulation layer 52, and a blocking layer 54 which surrounds an outer side of the charge storage layer 53.

Referring again to FIGS. 1 to 10, the semiconductor devices according to some example embodiments of the inventive concepts may include the stacked structure 40 in which the plurality of insulating layers 41 and the plurality of electrode layers 45 are alternately stacked on the substrate 21 having the cell region CEL and the connection region EXT. The first lower insulating layer 23, the plurality of transistors 25, the second lower insulating layer 27, the plurality of peripheral circuit interconnections 29, the lower embedded conductive layer 31, the third lower insulating layer 32, the intermediate embedded conductive layer 33, the fourth lower insulating layer 34, the alternate conductive line 35, the source mold layer 37, the support 38, and the fifth lower insulating layer 39 may be disposed between the substrate 21 and the stacked structure 40.

Upper surfaces of the lower embedded conductive layer 31 and the third lower insulating layer 32, respectively, may be substantially coplanar. The intermediate embedded conductive layer 33 and the fourth lower insulating layer 34 may be disposed on the lower embedded conductive layer 31 and the third lower insulating layer 32, respectively. The intermediate embedded conductive layer 33 may be disposed in the cell region CEL, and the fourth lower insulating layer 34 may be disposed in the connection region EXT. The fourth lower insulating layer 34 may be disposed at substantially the same level as the intermediate embedded conductive layer 33.

The alternate conductive line 35 may be disposed on the intermediate embedded conductive layer 33. The source mold layer 37 may be disposed on the fourth lower insulating layer 34. The source mold layer 37 may be disposed at substantially the same level as the alternate conductive line 35 in the connection region EXT. The support plate 38A may be disposed between the alternate conductive line 35 and the stacked structure 40 and between the source mold layer 37 and the stacked structure 40. The support bar 38B may be formed to be continuous with the support plate 38A. For example, the support bar 38B may extend/protrude from the support plate 38A toward the substrate 21. At least a portion of the support bar 38B may be disposed adjacent to a boundary between the cell region CEL and the connection region EXT. The support bar 38B may be in direct contact with side surfaces of the source mold layer 37 and the alternate conductive line 35. The source mold layer 37 (e.g., a shape/boundary thereof) may be defined in the connection region EXT by the support bar 38B.

Each of the plurality of electrode layers 45 may include the pad 45P which extends in the connection region EXT. The interlayer insulating layer 46 may be on (e.g., may cover at least part of a top surface of) the pad 45P in the connection region EXT. The interlayer insulating layer 46 may serve to insulate the plurality of contact structures 75 from each other.

The plurality of cell channel structures 59 which penetrate through the stacked structure 40, the support plate 38A, and the alternate conductive line 35 into the intermediate embedded conductive layer 33 may be disposed in the cell region CEL. The alternate conductive line 35 may pass through a side surface of the information storage pattern 55 to come into direct contact with a side surface of the channel pattern 56. The channel pattern 56 may be electrically connected to the alternate conductive line 35.

The plurality of dummy channel structures 59D which penetrate through the interlayer insulating layer 46, the stacked structure 40, the support plate 38A, and the source mold layer 37 into the fourth lower insulating layer 34 may be disposed in the connection region EXT. The plurality of dummy channel structures 59D may be in contact with the source mold layer 37. The dummy channel pattern 56D is not electrically connected to (i.e., is electrically isolated from) the alternate conductive line 35. The source mold layer 37 and the fourth lower insulating layer 34 may serve to electrically insulate the plurality of dummy channel structures 59D and the alternate conductive line 35 from each other. The source mold layer 37 and the fourth lower insulating layer 34 may serve to block a leakage current of the dummy channel pattern 56D.

The plurality of contact structures 75 may be disposed in the connection region EXT. Each of the plurality of contact structures 75 may be in contact (e.g., direct contact) with a selected/respective one of the plurality of electrode layers 45. Each of the plurality of contact structures 75 may pass through the interlayer insulating layer 46 to come into contact with the pad 45P. Each of the plurality of contact structures 75 may be in direct contact with at least one of the plurality of dummy channel structures 59D adjacent thereto. A width of an upper region of each of the plurality of contact structures 75 may be greater than that of a lower region thereof. The upper region of each of the plurality of contact structures 75 may be in contact with at least one of the plurality of dummy channel structures 59D adjacent thereto. The lower region of each of the plurality of contact structures 75 may be spaced apart from at least one of the plurality of dummy channel structures 59D adjacent thereto. At least one of the plurality of dummy channel structures 59D adjacent to the plurality of contact structures 75 may pass through the pad 45P.

FIGS. 11 to 14 are vertical cross-sectional views of semiconductor devices according to some example embodiments of the inventive concepts.

Figure 11:
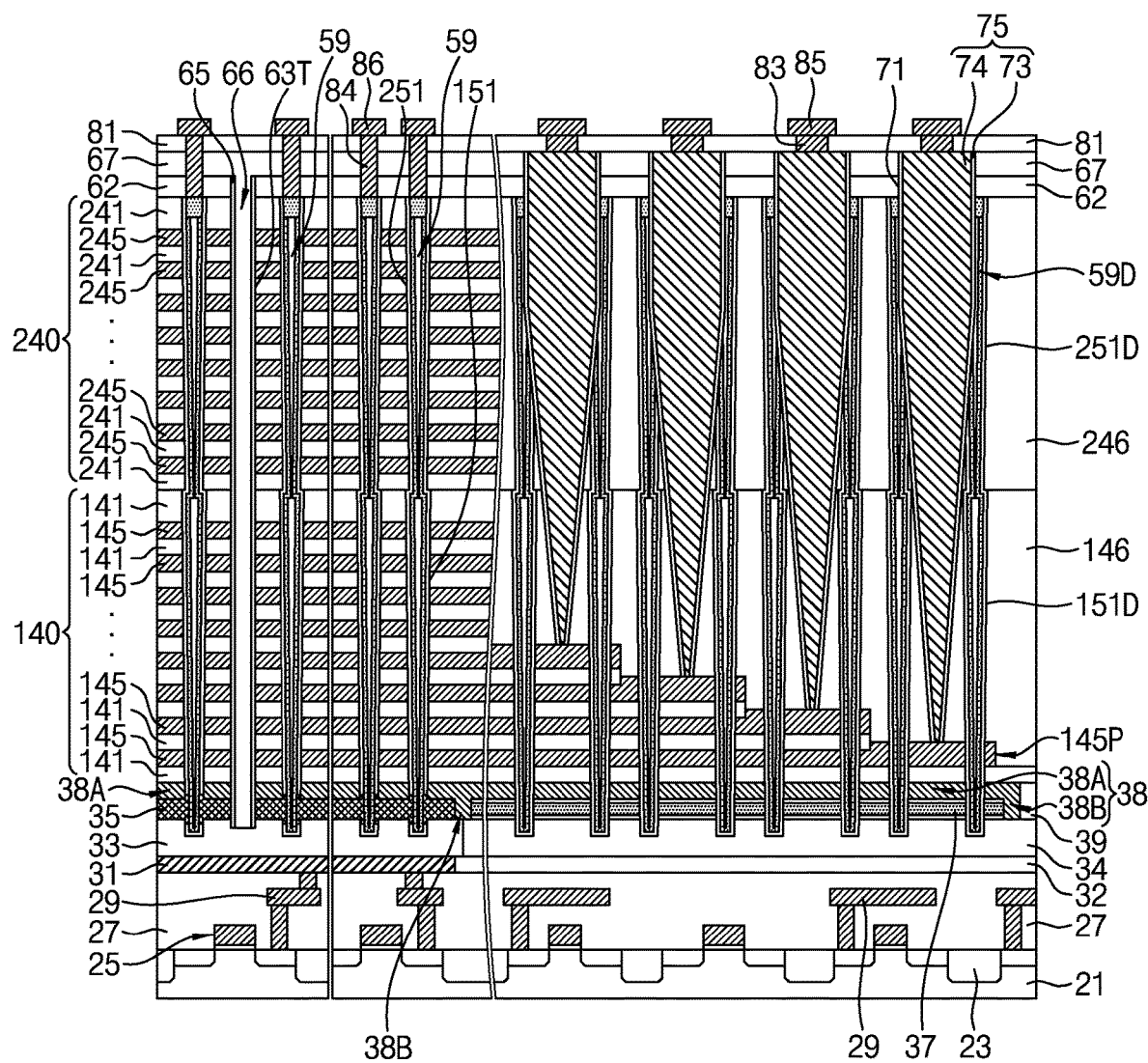
FIGS. 11-14 are vertical cross-sectional views of a semiconductor device according to example embodiments.

Referring to FIG. 11, a semiconductor device according to some example embodiments of the inventive concepts may include a substrate 21, a first lower insulating layer 23, a plurality of transistors 25, a second lower insulating layer 27, a plurality of peripheral circuit interconnections 29, a lower embedded conductive layer 31, a third lower insulating layer 32, an intermediate embedded conductive layer 33, a fourth lower insulating layer 34, an alternate conductive line 35, a source mold layer 37, a support 38, a fifth lower insulating layer 39, a lower stacked structure 140, a lower interlayer insulating layer 146, an upper stacked structure 240, an upper interlayer insulating layer 246, a plurality of lower cell channel holes 151, a plurality of upper cell channel holes 251, a plurality of cell channel structures 59, a plurality of lower dummy channel holes 151D, a plurality of upper dummy channel holes 251D, a plurality of dummy channel structures 59D, a first upper insulating layer 62, an isolation trench 63T, an isolation spacer 65, an isolation insulating layer 66, a second upper insulating layer 67, a plurality of contact holes 71, a plurality of contact structures 75, a third upper insulating layer 81, a plurality of upper plugs 83, a plurality of bit plugs 84, a plurality of upper interconnections 85, and a plurality of bit lines 86.

The support 38 may include a support plate 38A and a support bar 38B. The lower stacked structure 140 may include a plurality of lower insulating layers 141 and a plurality of lower electrode layers 145 which are alternately and repeatedly stacked. The upper stacked structure 240 may include a plurality of upper insulating layers 241 and a plurality of upper electrode layers 245 which are alternately and repeatedly stacked. Each of the plurality of lower electrode layers 145 and each of the plurality of upper electrode layers 245 may include a pad 145P. Each of the plurality of contact structures 75 may include a contact plug 74 and a contact spacer 73 which surrounds an outer side of the contact plug 74.

Figure 12:
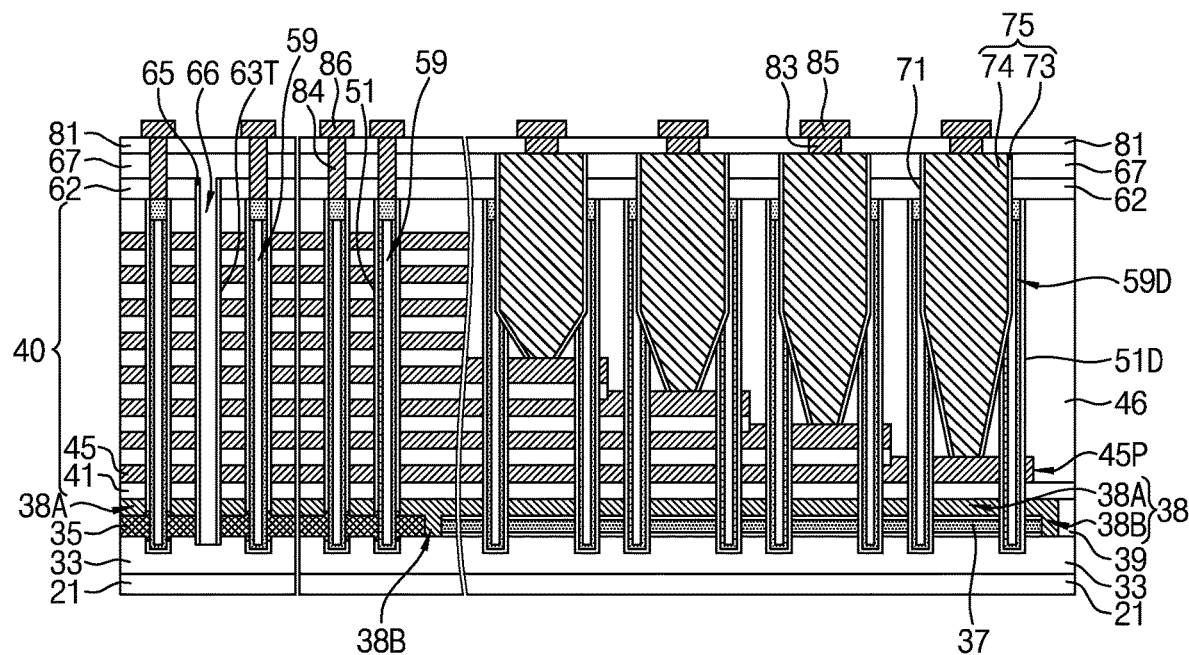

Referring to FIG. 12, a semiconductor device according to some example embodiments of the inventive concepts may include a substrate 21, an intermediate embedded conductive layer 33, an alternate conductive line 35, a source mold layer 37, a support 38, a fifth lower insulating layer 39, a stacked structure 40, an interlayer insulating layer 46, a plurality of cell channel holes 51, a plurality of cell channel structures 59, a plurality of dummy channel holes 51D, a plurality of dummy channel structures 59D, a first upper insulating layer 62, an isolation trench 63T, an isolation spacer 65, an isolation insulating layer 66, a second upper insulating layer 67, a plurality of contact holes 71, a plurality of contact structures 75, a third upper insulating layer 81, a plurality of upper plugs 83, a plurality of bit plugs 84, a plurality of upper interconnections 85, and a plurality of bit lines 86.

The support 38 may include a support plate 38A and a support bar 38B. The stacked structure 40 may include a plurality of insulating layers 41 and a plurality of electrode layers 45 which are alternately and repeatedly stacked. Each of the plurality of electrode layers 45 may include a pad 45P. Each of the plurality of contact structures 75 may include a contact plug 74 and a contact spacer 73 which surrounds an outer side of the contact plug 74.

Figure 13:
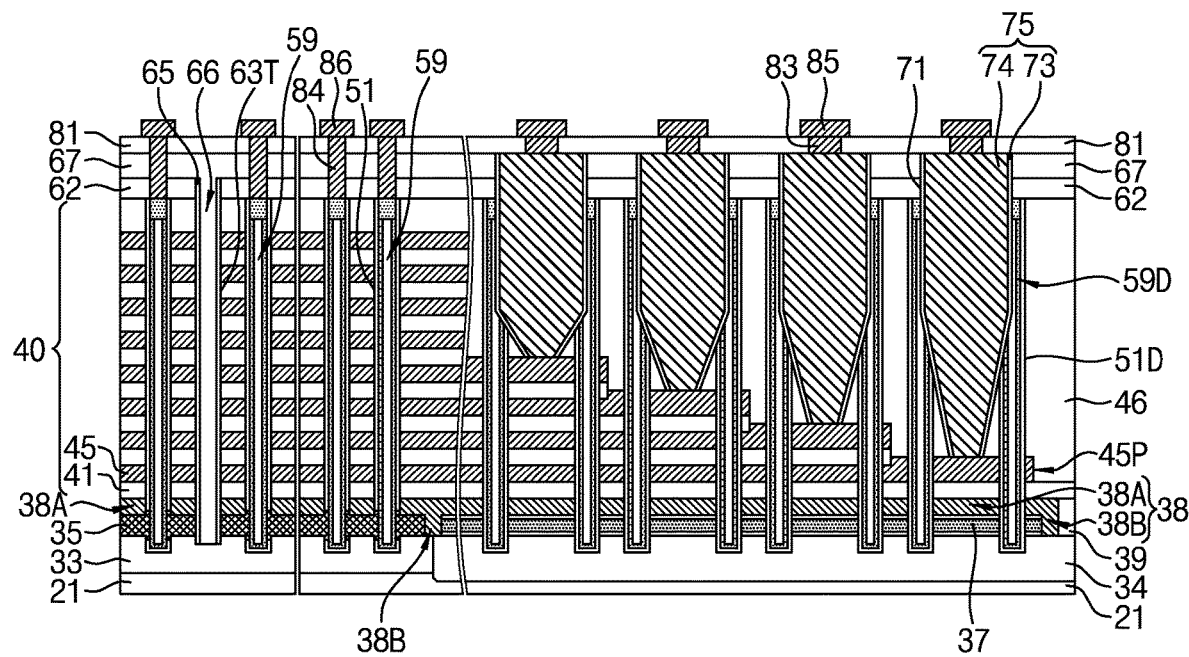

Referring to FIG. 13, a semiconductor device according to some example embodiments of the inventive concepts may include a substrate 21, an intermediate embedded conductive layer 33, a fourth lower insulating layer 34, an alternate conductive line 35, a source mold layer 37, a support 38, a fifth lower insulating layer 39, a stacked structure 40, an interlayer insulating layer 46, a plurality of cell channel holes 51, a plurality of cell channel structures 59, a plurality of dummy channel holes 51D, a plurality of dummy channel structures 59D, a first upper insulating layer 62, an isolation trench 63T, an isolation spacer 65, an isolation insulating layer 66, a second upper insulating layer 67, a plurality of contact holes 71, a plurality of contact structures 75, a third upper insulating layer 81, a plurality of upper plugs 83, a plurality of bit plugs 84, a plurality of upper interconnections 85, and a plurality of bit lines 86.

The support 38 may include a support plate 38A and a support bar 38B. The stacked structure 40 may include a plurality of insulating layers 41 and a plurality of electrode layers 45 which are alternately and repeatedly stacked. Each of the plurality of electrode layers 45 may include a pad 45P. Each of the plurality of contact structures 75 may include a contact plug 74 and a contact spacer 73 which surrounds an outer side of the contact plug 74.

Figure 14:
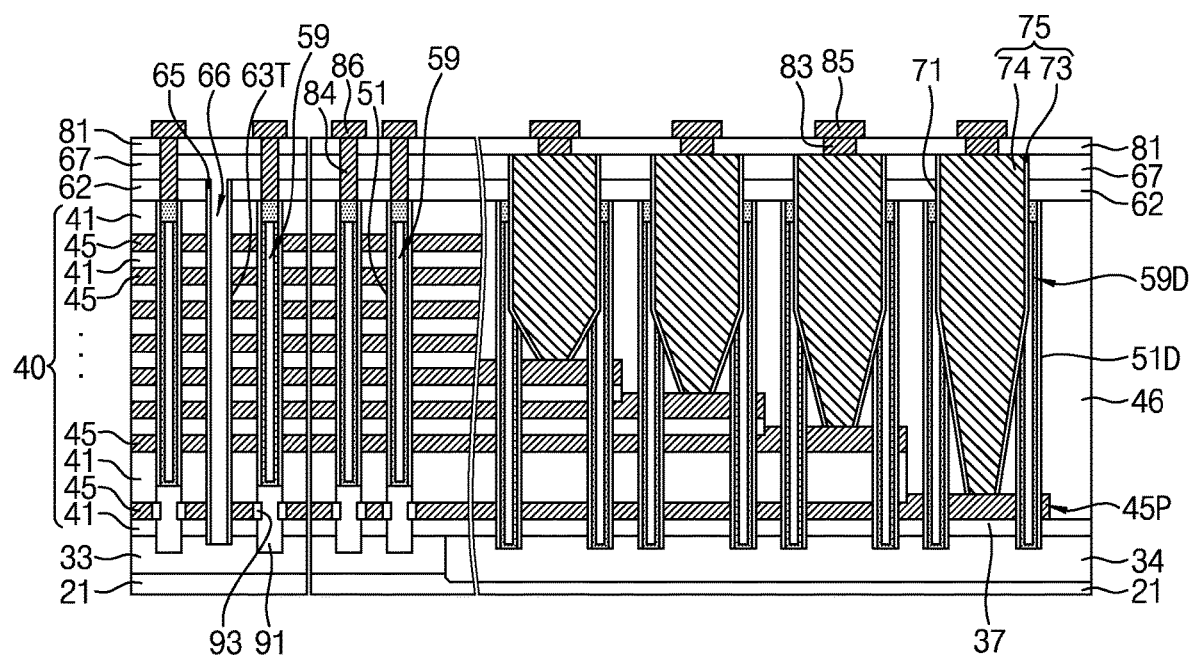

Referring to FIG. 14, a semiconductor device according to some example embodiment of the inventive concepts may include a substrate 21, an intermediate embedded conductive layer 33, a fourth lower insulating layer 34, a stacked structure 40, an interlayer insulating layer 46, a plurality of cell channel holes 51, a plurality of cell channel structures 59, a plurality of dummy channel holes 51D, a plurality of dummy channel structures 59D, a first upper insulating layer 62, an isolation trench 63T, an isolation spacer 65, an isolation insulating layer 66, a second upper insulating layer 67, a plurality of contact holes 71, a plurality of contact structures 75, a third upper insulating layer 81, a plurality of upper plugs 83, a plurality of bit plugs 84, a plurality of upper interconnections 85, a plurality of bit lines 86, a plurality of lower channel patterns 91, and a gate dielectric layer 93.

The stacked structure 40 may include a plurality of insulating layers 41 and a plurality of electrode layers 45 which are alternately and repeatedly stacked. Each of the plurality of electrode layers 45 may include a pad 45P. Each of the plurality of contact structures 75 may include a contact plug 74 and a contact spacer 73 which surrounds an outer side of the contact plug 74.

The intermediate embedded conductive layer 33 may include a semiconductor layer, such as single crystalline silicon containing N-type impurities. The intermediate embedded conductive layer 33 may be a source line or a CSL. The fourth lower insulating layer 34 may be disposed at substantially the same level as the intermediate embedded conductive layer 33 in the connection region EXT (see FIG. 3). In some example embodiments, the fourth lower insulating layer 34 may be referred to as a lower insulating layer. The plurality of dummy channel structures 59D may be in contact with the fourth lower insulating layer 34.

The plurality of lower channel patterns 91 may be disposed in a lower region of the plurality of cell channel holes 51. The plurality of lower channel patterns 91 may include a semiconductor layer formed using a selective epitaxial growth (SEG) process. Lower ends of the plurality of lower channel patterns 91 may be in direct contact with the intermediate embedded conductive layer 33. Upper ends of the plurality of lower channel patterns 91 may be disposed at a higher level than a lowermost layer of the plurality of electrode layers 45. The gate dielectric layer 93 may be disposed between the lowermost layer of the plurality of electrode layers 45 and the plurality of lower channel patterns 91.

FIGS. 15 to 25 are vertical cross-sectional views of a method of forming a semiconductor device according to some example embodiments of the inventive concepts. In some example embodiments, FIGS. 15 to 25 may be cross-sectional views taken along lines I-I' and II-II' of FIG. 3.

Figure 15:
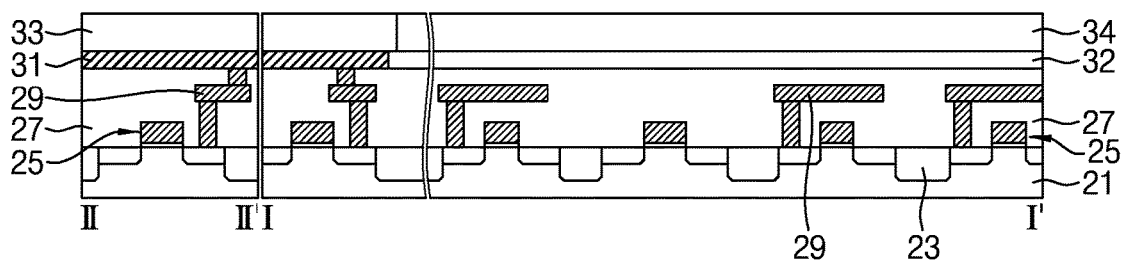
FIGS. 15-25 are vertical cross-sectional views of a method of forming a semiconductor device according to example embodiments.

Referring to FIGS. 3 and 15, a first lower insulating layer 23, a plurality of transistors 25, a second lower insulating layer 27, a plurality of peripheral circuit interconnections 29, a lower embedded conductive layer 31, a third lower insulating layer 32, an intermediate embedded conductive layer 33, and a fourth lower insulating layer 34 may be formed on a substrate 21.

The substrate 21 may include a semiconductor substrate such as a silicon wafer. The first lower insulating layer 23 may be a device isolation layer. The first lower insulating layer 23 may include an insulating layer formed using a shallow trench isolation (STI) method. The first lower insulating layer 23 may include silicon oxide, silicon nitride, silicon oxynitride, low-K dielectrics, or a combination thereof. The plurality of transistors 25 may be formed inside the substrate 21 and/or on the substrate 21 using various methods. The plurality of transistors 25 may include a Fin Field-effect transistor (FinFET), a multi-bridge channel (MBC) transistor, a nanowire transistor, a vertical transistor, a recess channel transistor, a 3D transistor, a planar transistor, or a combination thereof.

The second lower insulating layer 27 may cover the first lower insulating layer 23 and the plurality of transistors 25. The plurality of peripheral circuit interconnections 29 may be formed in the second lower insulating layer 27. The plurality of peripheral circuit interconnections 29 may be connected to the plurality of transistors 25. The plurality of peripheral circuit interconnections 29 may include horizontal interconnections and vertical interconnections having various shapes. The lower embedded conductive layer 31 and the third lower insulating layer 32 may be formed on the second lower insulating layer 27. The intermediate embedded conductive layer 33 and the fourth lower insulating layer 34 may be formed on the lower embedded conductive layer 31 and the third lower insulating layer 32.

Each of the second lower insulating layer 27, the third lower insulating layer 32, and the fourth lower insulating layer 34 may include silicon oxide, silicon nitride, silicon oxynitride, low-K dielectrics, or a combination thereof. The lower embedded conductive layer 31 may be electrically connected to the plurality of peripheral circuit interconnections 29. The plurality of peripheral circuit interconnections 29 and the lower embedded conductive layer 31 may include a metal, a metal nitride, a metal oxide, a metal silicide, polysilicon, a conductive carbon, or a combination thereof. The intermediate embedded conductive layer 33 may include a semiconductor layer such as polysilicon containing N-type impurities.

The intermediate embedded conductive layer 33 and the fourth lower insulating layer 34 may be formed using one or more of various thin film forming processes and a planarization process. The planarization process may include a chemical mechanical polishing (CMP) process, an etch-back process, or a combination thereof. Respective upper surfaces of the intermediate embedded conductive layer 33 and the fourth lower insulating layer 34 may be exposed at substantially the same level.

Figure 16:
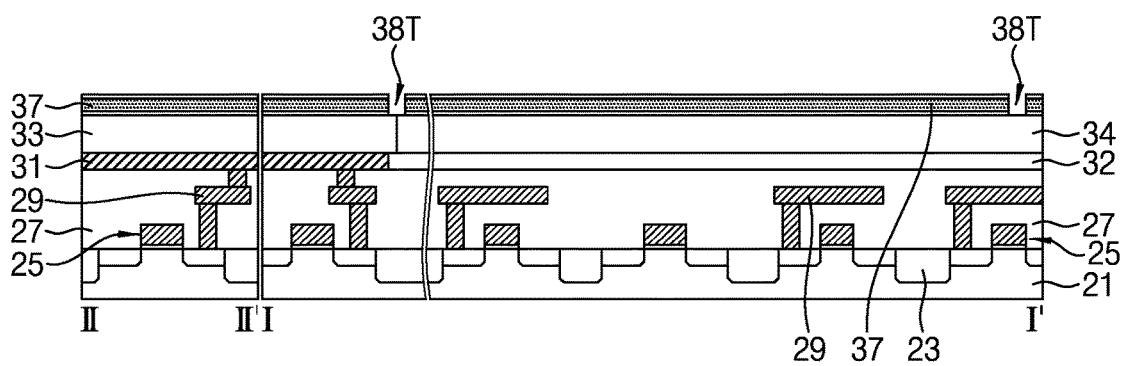

Referring to FIGS. 3 and 16, a source mold layer 37 may be formed on the intermediate embedded conductive layer 33 and the fourth lower insulating layer 34. A support trench 38T may be formed by patterning the source mold layer 37. The support trench 38T may pass through the source mold layer 37 to expose respective portions of the intermediate embedded conductive layer 33 and the fourth lower insulating layer 34.

The source mold layer 37 may include a material having an etch selectivity with respect to the intermediate embedded conductive layer 33 and the fourth lower insulating layer 34. The source mold layer 37 may include a lower source mold layer 37A, an intermediate source mold layer 37M, and an upper source mold layer 37B which are sequentially stacked, as shown in FIG. 9. In some example embodiments, the lower source mold layer 37A may include silicon oxide, the intermediate source mold layer 37M may include silicon nitride, and the upper source mold layer 37B may include silicon oxide. Accordingly, the source mold layer 37 may include one or more insulating materials.

Figure 17:
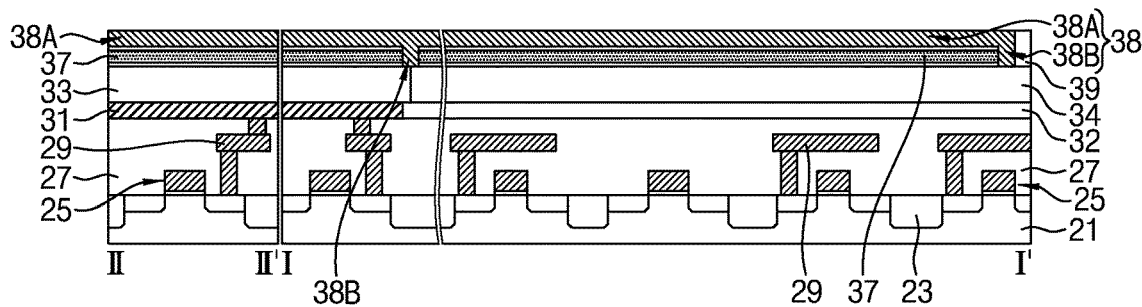

Referring to FIGS. 3 and 17, a support 38 and a fifth lower insulating layer 39 may be formed on the substrate 21 having the source mold layer 37 and the support trench 38T. The support 38 may include a support plate 38A and a support bar 38B. The support plate 38A may cover the source mold layer 37. The support bar 38B may be formed in the support trench 38T. The support bar 38B may be formed to be continuous with the support plate 38A.

The support 38 may include a material having an etch selectivity with respect to the source mold layer 37. In some example embodiments, the support 38 may include polysilicon. The fifth lower insulating layer 39 may be in contact with a side surface of the support 38. The fifth lower insulating layer 39 may include silicon oxide, silicon nitride, silicon oxynitride, low-K dielectrics, or a combination thereof.

Figure 18:
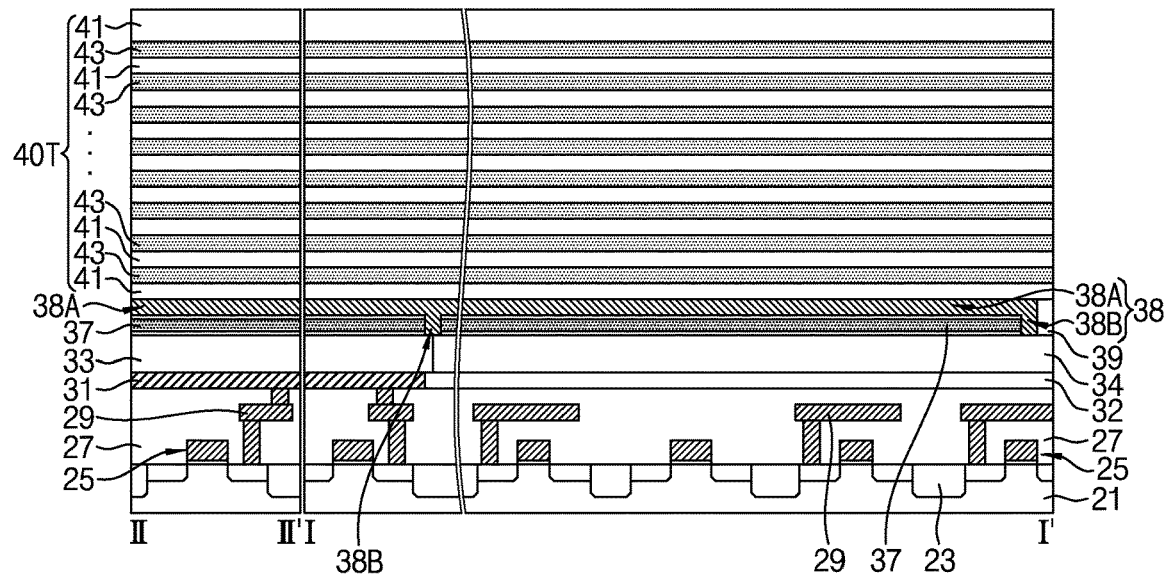

Referring to FIGS. 3 and 18, a spare stacked structure 40T may be formed on the support 38. The spare stacked structure 40T may include a plurality of insulating layers 41 and a plurality of mold layers (e.g., sacrificial layers) 43 which are alternately and repeatedly stacked. The plurality of mold layers 43 may include a material having an etch selectivity with respect to the plurality of insulating layers 41. In some example embodiments, the plurality of mold layers 43 may include nitride, such as silicon nitride, and the plurality of insulating layers 41 may include oxide, such as silicon oxide.

Figure 19:
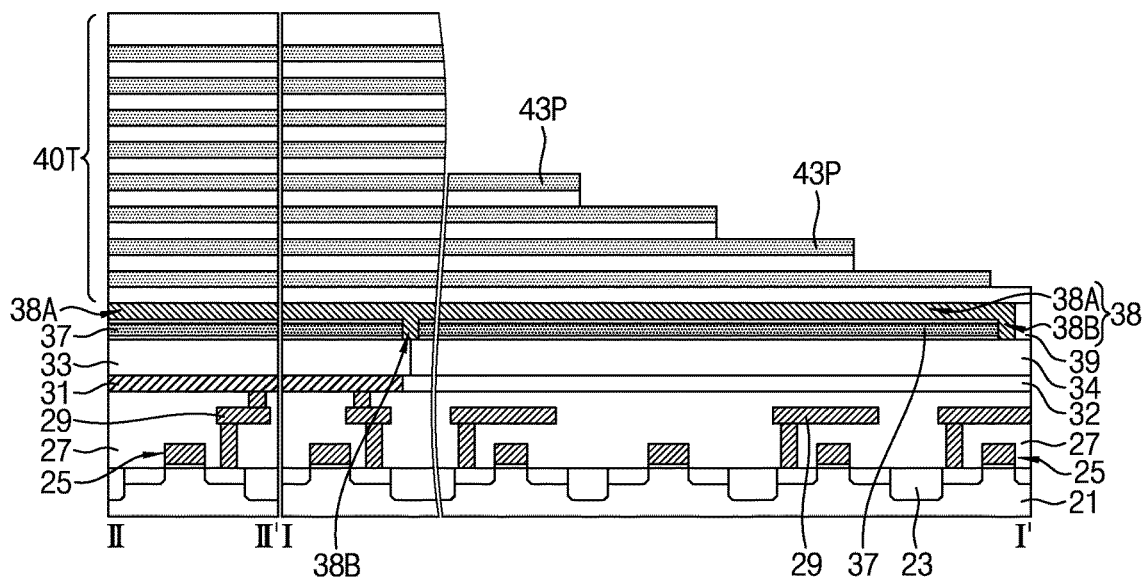

Referring to FIGS. 3 and 19, a plurality of spare pads 43P may be formed by patterning the plurality of insulating layers 41 and the plurality of mold layers 43 using a patterning process. Each of the plurality of spare pads 43P may be included in a corresponding one of the plurality of mold layers 43. Each of the plurality of spare pads 43P may be limited to an end of a corresponding one of the plurality of mold layers 43. Upper surfaces and side surfaces of the plurality of spare pads 43P may be exposed.

Figure 20:
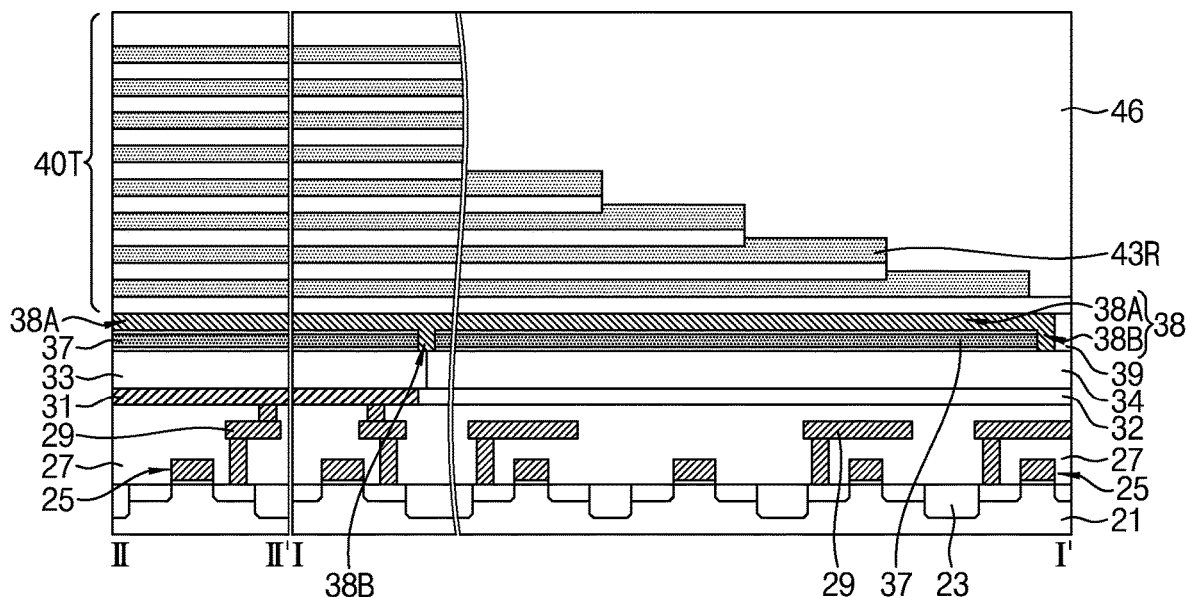

Referring to FIGS. 3 and 20, a plurality of raised spare pads 43R may be formed by increasing thicknesses of the plurality of spare pads 43P. An interlayer insulating layer 46 which covers the plurality of raised spare pads 43R may be formed. The interlayer insulating layer 46 may include silicon oxide, silicon nitride, silicon oxynitride, low-K dielectrics, or a combination thereof.

Figure 21:
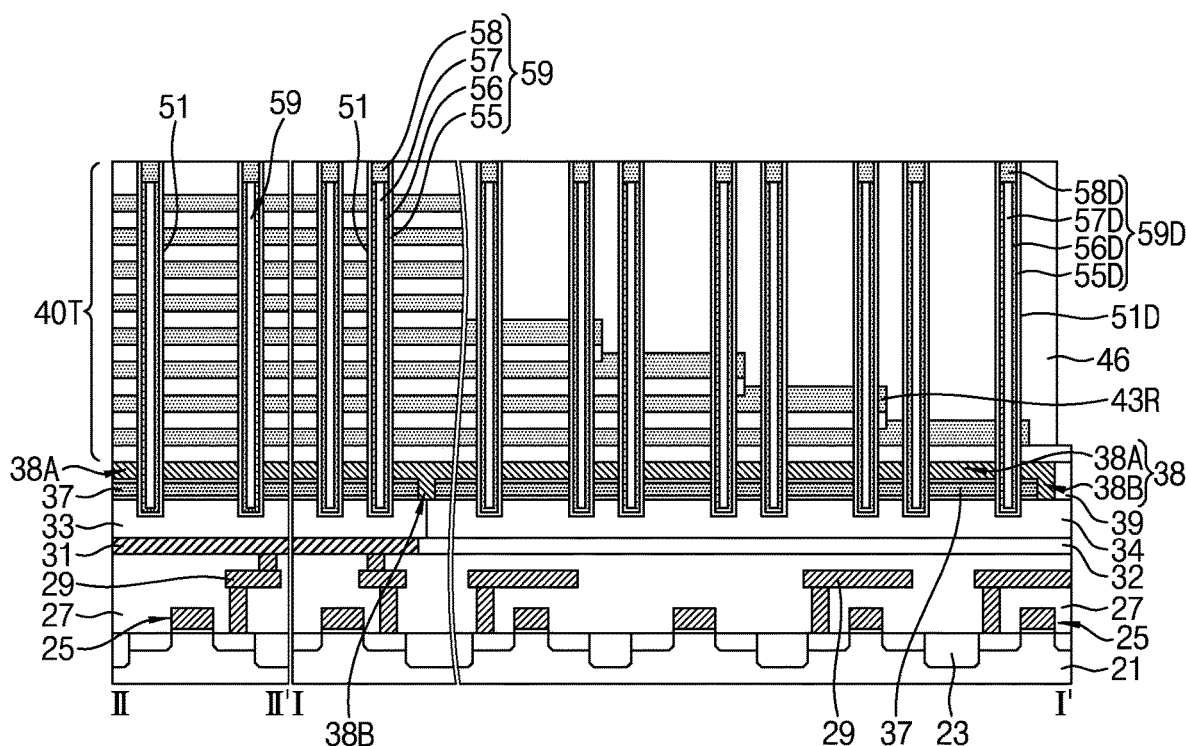

Referring to FIGS. 3 and 21, a plurality of cell channel holes 51 which penetrate through the spare stacked structure 40T, the support plate 38A, and the source mold layer 37 into the intermediate embedded conductive layer 33 may be formed. A plurality of dummy channel holes 51D which penetrate through the interlayer insulating layer 46, the spare stacked structure 40T, the support plate 38A, and the source mold layer 37 into the fourth lower insulating layer 34 may be formed. The plurality of cell channel holes 51 and the plurality of dummy channel holes 51D may be simultaneously formed using a patterning process. Each of the plurality of dummy channel holes 51D may pass through a corresponding one of the plurality of raised spare pads 43R.

A plurality of cell channel structures 59 may be formed in the plurality of cell channel holes 51, respectively. A plurality of dummy channel structures 59D may be formed in the plurality of dummy channel holes 51D, respectively. Each of the plurality of cell channel structures 59 may include an information storage pattern 55, a channel pattern 56, a core pattern 57, and a bit pad 58. The information storage pattern 55 may include a tunnel insulation layer 52, a charge storage layer 53, and a blocking layer 54, as shown in FIG. 10. Each of the plurality of dummy channel structures 59D may include a dummy information storage pattern 55D, a dummy channel pattern 56D, a dummy core pattern 57D, and a dummy bit pad 58D. The dummy information storage pattern 55D may include a dummy tunnel insulation layer 52D, a dummy charge storage layer 53D, and a dummy blocking layer 54D, as shown in FIG. 4.

The core pattern 57 and the dummy core pattern 57D may include an insulating layer such as silicon oxide. The channel pattern 56 and the dummy channel pattern 56D may include a semiconductor layer such as polysilicon. The channel pattern 56 and the dummy channel pattern 56D may include P-type impurities. The bit pad 58 and the dummy bit pad 58D may include a semiconductor layer such as polysilicon, a metal layer, a metal silicide layer, a metal oxide layer, a metal nitride layer, or a combination thereof. In some example embodiments, the bit pad 58 and the dummy bit pad 58D may include a polysilicon layer containing N-type impurities. The bit pad 58 may be in contact with the channel pattern 56, and the dummy bit pad 58D may be in contact with the dummy channel pattern 56D.

The tunnel insulation layer 52 and the dummy tunnel insulation layer 52D may include an insulating layer such as silicon oxide. The charge storage layer 53 and the dummy charge storage layer 53D may include a material different from that of the tunnel insulation layer 52 and the dummy tunnel insulation layer 52D. The charge storage layer 53 and the dummy charge storage layer 53D may include an insulating layer such as silicon nitride. The blocking layer 54 and the dummy blocking layer 54D may include a material different from that of the charge storage layer 53 and the dummy charge storage layer 53D. The blocking layer 54 and the dummy blocking layer 54D may include an insulating layer such as silicon oxide, metal oxide, or a combination thereof.

Figure 22:
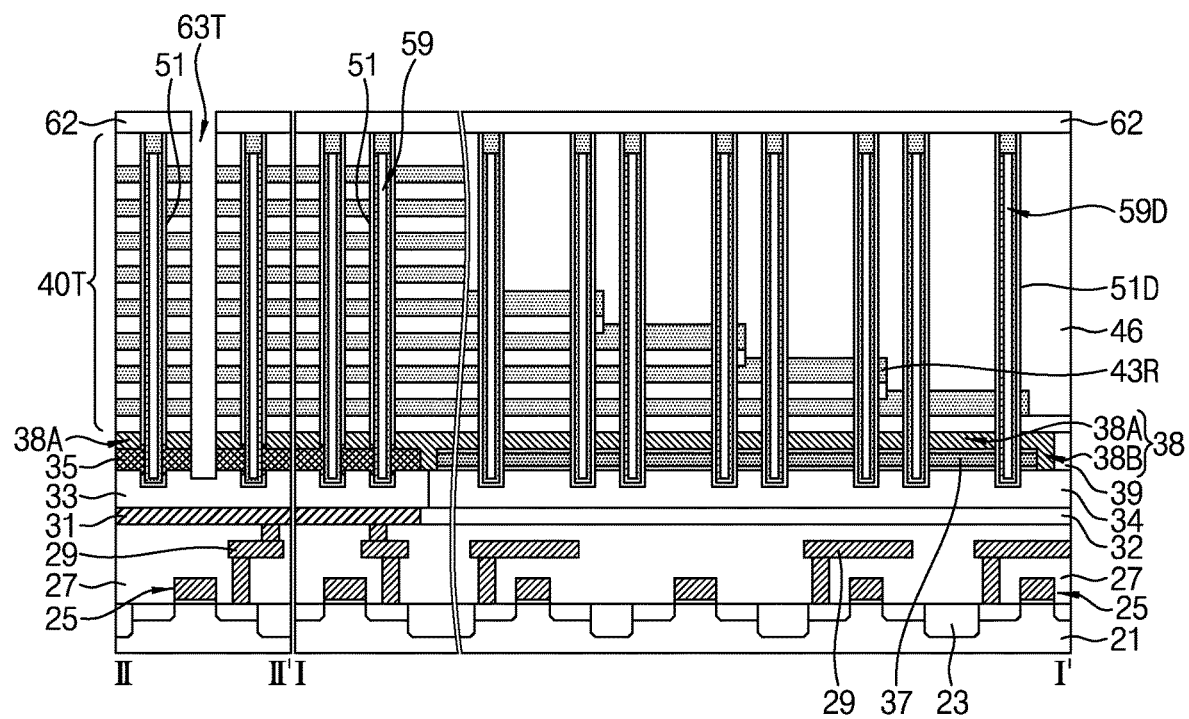

Referring to FIGS. 3 and 22, a first upper insulating layer 62 which covers the plurality of cell channel structures 59 and the plurality of dummy channel structures 59D may be formed on the spare stacked structure 40T and the interlayer insulating layer 46. An isolation trench 63T which passes through the first upper insulating layer 62, the spare stacked structure 40T, and the support plate 38A may be formed. The source mold layer 37 may be partially removed and an alternate conductive line 35 may be formed. The alternate conductive line 35 may be formed using a thin film forming process and an etch-back process. The isolation trench 63T may pass through the alternate conductive line 35. A portion of the intermediate embedded conductive layer 33 may be exposed to/by a bottom of the isolation trench 63T.

The first upper insulating layer 62 may include an insulating layer such as silicon oxide. The alternate conductive line 35 may include a semiconductor layer such as polysilicon, a metal layer, a metal silicide layer, a metal oxide layer, a metal nitride layer, or a combination thereof. In some example embodiments, the alternate conductive line 35 may include a polysilicon layer containing N-type impurities. The alternate conductive line 35 may pass through the information storage pattern 55 to come into direct contact with the channel pattern 56.

Figure 23:
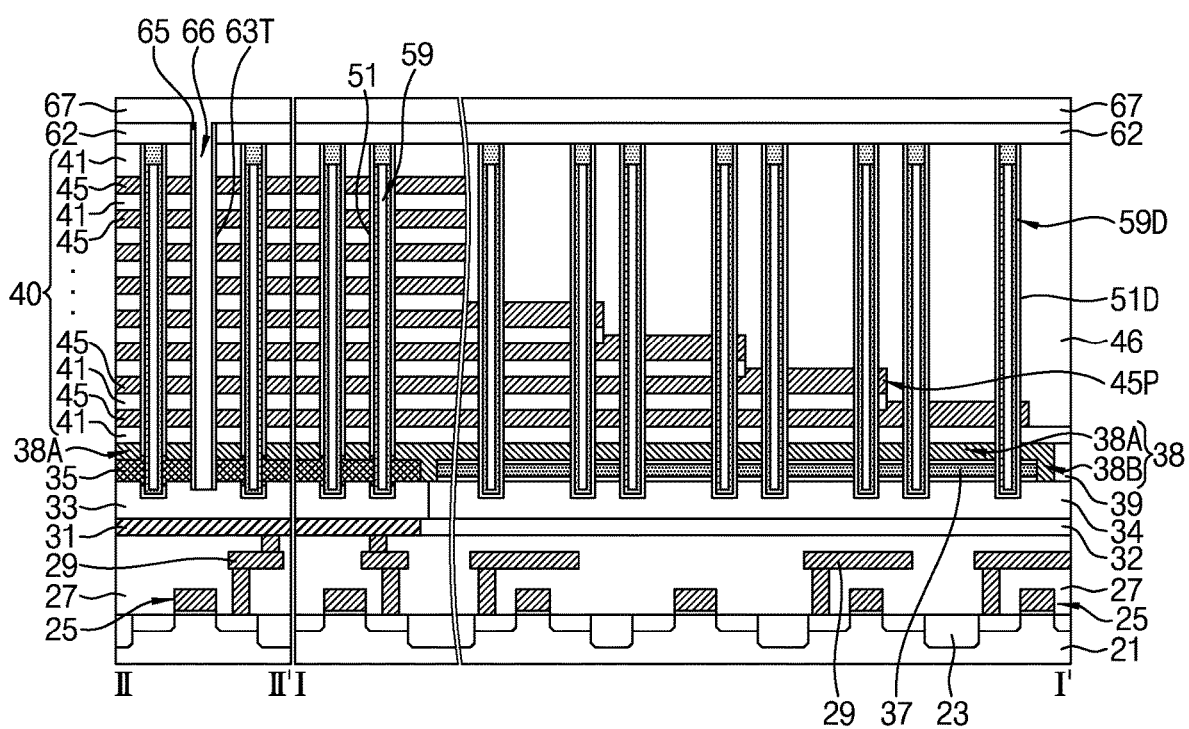

Referring to FIGS. 3 and 23, the plurality of mold layers 43 may be removed and a plurality of electrode layers 45 may be formed. Each of the plurality of electrode layers 45 may include a pad 45P. An isolation spacer 65 may be formed on a sidewall of the isolation trench 63T. An isolation insulating layer 66 which fills an inside of the isolation trench 63T and a second upper insulating layer 67 which covers the first upper insulating layer 62 may be formed. The plurality of insulating layers 41 and the plurality of electrode layers 45 which are alternately and repeatedly stacked may constitute a stacked structure 40.

The plurality of electrode layers 45 may include a conductive layer such as a metal, a metal silicide, a metal oxide, a metal nitride, polysilicon, a conductive carbon, or a combination thereof. Each of the isolation spacer 65, the isolation insulating layer 66, and the second upper insulating layer 67 may include silicon oxide, silicon nitride, silicon oxynitride, low-K dielectrics, or a combination thereof.

Figure 24:
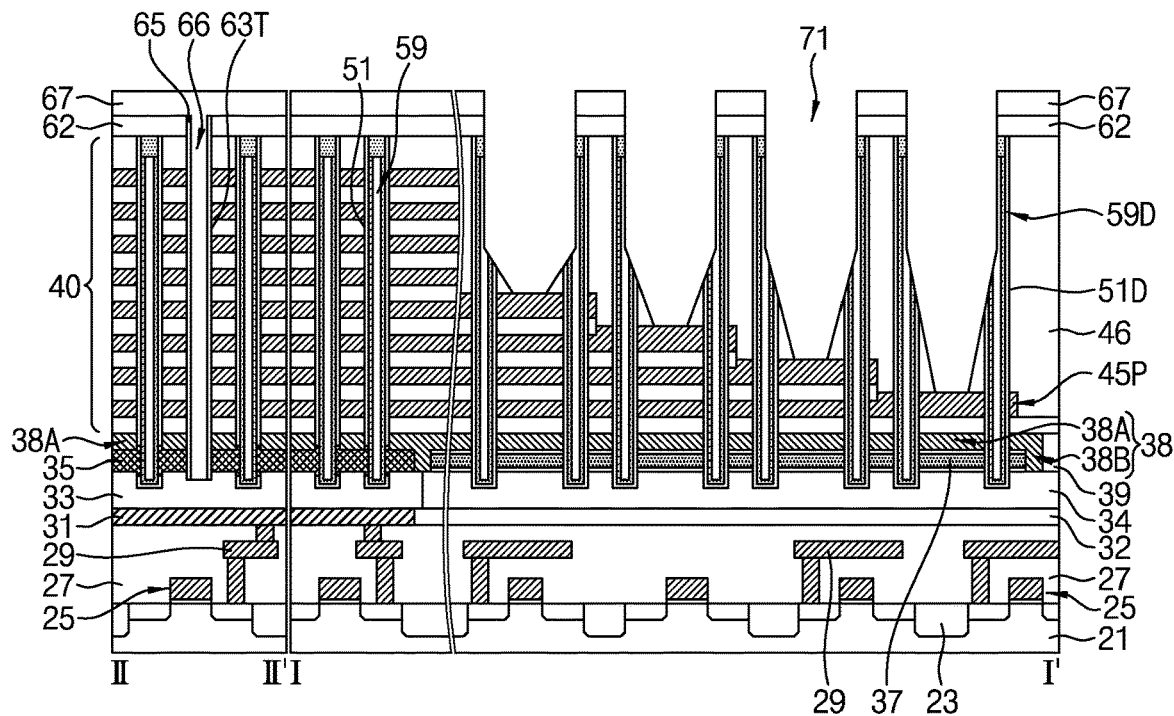

Referring to FIGS. 3 and 24, a plurality of contact holes 71 which pass through the second upper insulating layer 67, the first upper insulating layer 62, and the interlayer insulating layer 46 to expose portions of the plurality of electrode layers 45 may be formed. The pad 45P may be exposed to/by bottoms of the plurality of contact holes 71. A horizontal width of an upper portion of each of the plurality of contact holes 71 may be greater than a horizontal width of a lower portion. A vertical height of each of the plurality of contact holes 71 may be greater than a horizontal width.

The plurality of contact holes 71 may be formed using an anisotropic etching process. Each of the plurality of contact holes 71 may partially overlap (e.g., merge with) at least one of the plurality of dummy channel holes 51D adjacent thereto. While the plurality of contact holes 71 are formed, the plurality of dummy channel structures 59D may be partially removed. The plurality of dummy channel structures 59D may be exposed to/by sidewalls of the plurality of contact holes 71. In some example embodiments, the dummy information storage pattern 55D, the dummy channel pattern 56D, and the dummy core pattern 57D may be exposed to/by the sidewalls of the plurality of contact holes 71.

A process margin in the process of forming the plurality of contact holes 71 may be significantly increased.

Figure 25:
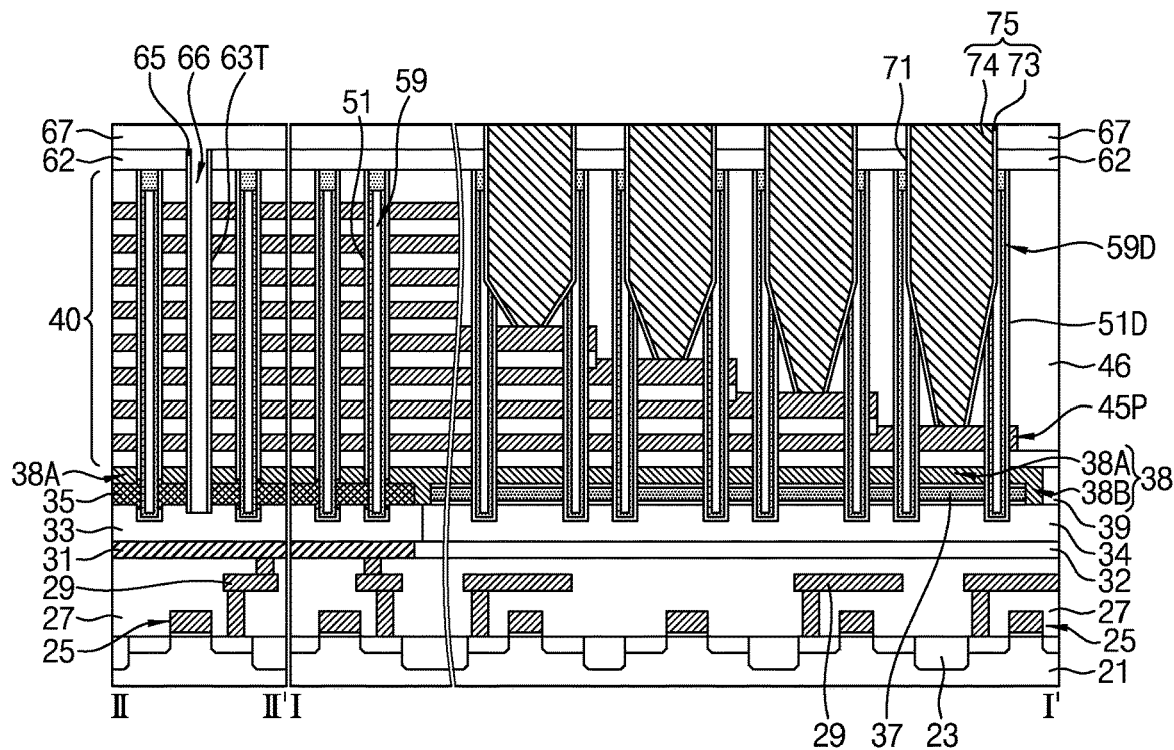

Referring to FIGS. 3 and 25, a plurality of contact structures 75 may be formed in the plurality of contact holes 71. Each of the plurality of contact structures 75 may include a contact plug 74 and a contact spacer 73 which extends around (e.g., surrounds) an outer side of the contact plug 74.

The contact spacer 73 may be formed using a thin film forming process and an anisotropic etching process. The contact spacer 73 may include an insulating layer such as silicon oxide, silicon nitride, silicon oxynitride, low-K dielectrics, high-K dielectrics, or a combination thereof. The contact plug 74 may be formed using a thin film forming process and a planarization process. The contact plug 74 may include a conductive layer such as a metal, a metal nitride, a metal oxide, a metal silicide, polysilicon, a conductive carbon, or a combination thereof.

Referring again to FIGS. 1 and 3, a third upper insulating layer 81 which covers the plurality of contact structures 75 may be formed on the second upper insulating layer 67. A plurality of upper plugs 83 may be formed which pass through the third upper insulating layer 81 to come into contact with the plurality of contact structures 75. A plurality of bit plugs 84 may be formed which pass through the third upper insulating layer 81, the second upper insulating layer 67, and the first upper insulating layer 62 to come into contact with the bit pad 58. A plurality of upper interconnections 85 and a plurality of bit lines 86 may be formed on the third upper insulating layer 81. The plurality of upper interconnections 85 may be in contact with the plurality of upper plugs 83. The plurality of bit lines 86 may be in contact with the plurality of bit plugs 84.

The third upper insulating layer 81 may include an insulating layer such as silicon oxide, silicon nitride, silicon oxynitride, low-K dielectrics, or a combination thereof. Each of the plurality of upper plugs 83, the plurality of bit plugs 84, the plurality of upper interconnections 85, and the plurality of bit lines 86 may include a conductive layer such as a metal, a metal nitride, a metal oxide, a metal silicide, polysilicon, a conductive carbon, or a combination thereof.

According to some example embodiments of the inventive concepts, a contact structure which is in direct contact with at least one of a plurality of dummy channel structures adjacent thereto is provided. The plurality of dummy channel structures can be electrically insulated from a source line. A process margin of the contact structure can be significantly increased. A semiconductor device which is advantageous for high integration while preventing/inhibiting a leakage current can be implemented.

Though example embodiments of the inventive concepts have been described with reference to the accompanying drawings, it should be understood by those skilled in the art that various modifications may be made without departing from the scope of the inventive concepts. Therefore, the above-described example embodiments should be considered in a descriptive sense only and not for purposes of limitation.

What is claimed is:

1. A semiconductor device comprising:
   a substrate having a cell region and a connection region adjacent to the cell region;
   a stacked structure in which a plurality of insulating layers and a plurality of electrode layers are alternately stacked on the substrate;
   a source mold layer between the substrate and the stacked structure in the connection region;
   an alternate conductive line between the substrate and the stacked structure in the cell region;
   a plurality of cell channel structures in the cell region, the plurality of cell channel structures extending into the alternate conductive line while passing through the stacked structure;
   a plurality of dummy channel structures in the connection region, the plurality of dummy channel structures extending into the source mold layer while passing through the stacked structure; and
   a contact structure that is among the plurality of dummy channel structures in the connection region while being in direct contact with one of the plurality of electrode layers,
   wherein each of the plurality of cell channel structures comprises:
      a channel pattern, and
      an information storage pattern outside the channel pattern,
   wherein the channel pattern is electrically connected to the alternate conductive line,
   wherein each of the plurality of dummy channel structures comprises:
      a dummy channel pattern, and
      a dummy information storage pattern outside the dummy channel pattern,
   wherein the dummy channel pattern is not electrically connected to the alternate conductive line.

2. The semiconductor device according to claim 1, wherein the alternate conductive line is at a level substantially equal to that of the source mold layer, and
   wherein the channel pattern passes through the alternate conductive line and has a lower surface that is below a lower surface of the alternate conductive line.

3. The semiconductor device according to claim 1, wherein the alternate conductive line has a thickness substantially equal to that of the source mold layer, and
   wherein the channel pattern is between spaced-apart portions of the alternate conductive line.

4. The semiconductor device according to claim 1, wherein the alternate conductive line is in direct contact with the channel pattern while passing through a side surface of the information storage pattern.

5. The semiconductor device according to claim 1, further comprising:
   a first portion that is between the alternate conductive line and the stacked structure; and
   a second portion that is between the substrate and the stacked structure and extends from the first portion,
   wherein the second portion is in direct contact with side surfaces of the alternate conductive line and the source mold layer.

6. The semiconductor device according to claim 5, wherein the second portion extends between the alternate conductive line and the source mold layer.

7. The semiconductor device according to claim 6, wherein the second portion protrudes toward the substrate.

8. The semiconductor device according to claim 1, wherein the contact structure is in direct contact with at least one of the plurality of dummy channel structures adjacent thereto.

9. The semiconductor device according to claim 1, wherein the contact structure comprises:
   a contact plug; and
   a contact spacer surrounding an outer side of the contact plug.

10. The semiconductor device according to claim 1, wherein:
    a width of an upper region of the contact structure is greater than that of a lower region of the contact structure;
    the upper region of the contact structure is in direct contact with at least one of the plurality of dummy channel structures adjacent thereto; and
    the lower region of the contact structure is spaced apart from the at least one of the plurality of dummy channel structures adjacent thereto.

11. The semiconductor device according to claim 1, wherein the contact structure is in direct contact with four of the plurality of dummy channel structures that are spaced apart from one another.

12. The semiconductor device according to claim 1, wherein the contact structure comprises a protrusion penetrating into one of the plurality of dummy channel structures adjacent thereto.

13. The semiconductor device according to claim 12, wherein the protrusion overlaps with a center of the one of the plurality of dummy channel structures.

14. The semiconductor device according to claim 1, wherein the contact structure is in direct contact with the dummy channel pattern and the dummy information storage pattern.

15. The semiconductor device according to claim 1, wherein:
    each of the plurality of cell channel structures further comprises a core pattern;
    each of the plurality of dummy channel structures further comprises a dummy core pattern;
    the dummy channel pattern is outside the dummy core pattern; and
    the contact structure passes through the dummy information storage pattern and the dummy channel pattern to be in direct contact with the dummy core pattern.

16. The semiconductor device according to claim 1, wherein:
    the information storage pattern comprises
       a tunnel insulation layer outside the channel pattern,
       a charge storage layer outside the tunnel insulation layer, and
       a blocking layer outside the charge storage layer; and
    the dummy information storage pattern comprises a dummy tunnel insulation layer outside the dummy channel pattern, a dummy charge storage layer outside the dummy tunnel insulation layer, and a dummy blocking layer outside the dummy charge storage layer.

17. The semiconductor device according to claim 1, further comprising:

an interlayer insulating layer in the connection region, wherein each of the plurality of electrode layers comprises a pad portion extending into the connection region, wherein the interlayer insulating layer is on the pad portion, wherein the contact structure passes through the interlayer insulating layer to be in direct contact with the pad portion.

18. The semiconductor device according to claim 17, wherein one of the plurality of dummy channel structures adjacent to the contact structure passes through the pad portion.

19. A semiconductor device comprising:

a substrate having a cell region and a connection region adjacent to the cell region;

a stacked structure in which a plurality of insulating layers and a plurality of electrode layers are alternately stacked on the substrate;

a source mold layer between the substrate and the stacked structure in the connection region;

an alternate conductive line between the substrate and the stacked structure in the cell region;

a plurality of cell channel structures in the cell region, the plurality of cell channel structures extending into the alternate conductive line while passing through the stacked structure;

a plurality of dummy channel structures in the connection region, the plurality of dummy channel structures extending into the source mold layer while passing through the stacked structure; and a contact structure that is among the plurality of dummy channel structures in the connection region while being in direct contact with one of the plurality of electrode layers, wherein each of the plurality of cell channel structures comprises a channel pattern electrically connected to the alternate conductive line, wherein each of the plurality of dummy channel structures comprises a dummy channel pattern, wherein the dummy channel pattern is not electrically connected to the alternate conductive line.

20. A semiconductor device comprising:

a substrate having a cell region and a connection region adjacent to the cell region;

a stacked structure in which a plurality of insulating layers and a plurality of electrode layers are alternately stacked on the substrate;

a source mold layer between the substrate and the stacked structure in the connection region;

an alternate conductive line between the substrate and the stacked structure in the cell region;

a plurality of cell channel structures in the cell region, wherein the alternate conductive line is on opposite sidewalls of each of the plurality of cell channel structures;

a plurality of dummy channel structures in the connection region, the plurality of dummy channel structures extending into the source mold layer while passing through the stacked structure; and a contact structure that is among the plurality of dummy channel structures in the connection region while being in direct contact with one of the plurality of electrode layers, wherein each of the plurality of cell channel structures comprises a channel pattern electrically connected to the alternate conductive line, wherein each of the plurality of dummy channel structures comprises a dummy channel pattern, wherein the dummy channel pattern is not electrically connected to the alternate conductive line.

* * * * *